United States Patent
Nakajima et al.

(10) Patent No.: US 6,753,596 B1
(45) Date of Patent: Jun. 22, 2004

(54) RESIN-SEALED SEMICONDUCTOR DEVICE

(75) Inventors: Dai Nakajima, Tokyo (JP); Kiyoshi Ishida, Tokyo (JP); Taketoshi Shikano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/436,262

(22) Filed: May 13, 2003

(30) Foreign Application Priority Data

Dec. 6, 2002 (JP) ........................................ 2002-354812

(51) Int. Cl.⁷ ............................................. H01L 23/495
(52) U.S. Cl. ...................... 257/675; 257/666; 257/689; 257/706; 257/708
(58) Field of Search ............................. 257/675, 666, 257/689, 706, 708, 787

(56) References Cited

U.S. PATENT DOCUMENTS

| | | | | |
|---|---|---|---|---|
| 6,262,477 B1 | * | 7/2001 | Mahulikar et al. | ........... 257/698 |
| 6,307,755 B1 | * | 10/2001 | Williams et al. | ............. 361/813 |
| 6,329,711 B1 | * | 12/2001 | Kawahara et al. | .......... 257/698 |
| 6,376,910 B1 | * | 4/2002 | Munoz et al. | .............. 257/741 |
| 6,392,294 B1 | * | 5/2002 | Yamaguchi | ................. 257/690 |
| 6,437,427 B1 | * | 8/2002 | Choi | .......................... 257/666 |
| 6,483,178 B1 | * | 11/2002 | Chuang | ...................... 257/672 |
| 6,498,392 B2 | * | 12/2002 | Azuma | ........................ 257/676 |
| 6,610,924 B1 | * | 8/2003 | Lee et al. | .................. 174/52.4 |
| 2002/0096756 A1 | * | 7/2002 | Kobauakawa | ............... 257/687 |

FOREIGN PATENT DOCUMENTS

| JP | 5-235228 | 9/1993 |
|---|---|---|
| JP | 7-273270 | 10/1995 |
| JP | 9-92778 | 4/1997 |

* cited by examiner

*Primary Examiner*—Jasmine Clark
(74) *Attorney, Agent, or Firm*—Oblon, Spivak, McClelland, Maier & Neustadt, P.C.

(57) ABSTRACT

A resin-sealed semiconductor device includes a metallic plate and a semiconductor element soldered thereto. The metallic plate has a semiconductor element mounting region formed on one surface thereof and a plurality of squared recesses defined lengthwise and crosswise in the one surface at approximately regular intervals at locations other than the semiconductor element mounting region.

7 Claims, 3 Drawing Sheets

RESIN-SEALED SEMICONDUCTOR DEVICE

BACKGROUND OF THE INVENTION

1. Field of the Invention

The present invention relates generally to a semiconductor device and, in particular but not exclusively, to a resin-sealed power semiconductor device.

2. Description of the Related Art

Japanese Laid-Open Patent Publication (unexamined) No. 5-235228 discloses a resin-sealed semiconductor device that has a semiconductor element firmly fixed, by soldering, to a frame having a plurality of grooves defined therein. During soldering, a soldering material then wetting a frame spreads over the frame and is then blocked by an internal groove, while during a subsequent resin-sealing process an external groove prevents foreign substances from entering the semiconductor element thorough an interface between a molding resin and the frame.

A semiconductor device as disclosed in Japanese Laid-Open Patent Publication (unexamined) No. 9-92778 includes a frame having a die pad region on which a semiconductor element is placed. A plurality of recesses are formed in the die pad region to enhance the degree of adhesion between the frame and a sealing resin and prevent an outflow of a bonding agent that is used for die bonding.

Japanese Laid-Open Patent Publication (unexamined) No. 7-273270 discloses a frame structure having a plurality of recesses each in the form of an octopus pot for the purpose of enhancing the degree of adhesion between the frame and a sealing resin. The octopus pot-shaped recesses can be formed at a low cost by repeating press working twice.

In the semiconductor device as disclosed in Japanese Laid-Open Patent Publication No. 5-235228, however, the amount of the soldering material flowing into the grooves cannot be controlled constant and, hence, the thickness of the soldering material cannot be stabilized.

In the semiconductor device as disclosed in Japanese Laid-Open Patent Publication No. 9-92778, no attention has been paid to the state of the molten solder having a reduced viscosity. During soldering, the molten solder passes portions other than the recesses and, hence, there arises a problem in that the flow of the molten solder cannot be satisfactorily controlled, making it impossible to strictly control the amount of the soldering material immediately below the semiconductor element.

The semiconductor device as disclosed in Japanese Laid-Open Patent Publication No. 7-273270 involves a problem in that there is a limit in reducing the pitch between the spots to be processed if a die assembly has a complicated shape and is made using a relatively inexpensive processing method such as, for example, cutting work. If a further reduction in pitch of the octopus pot-shaped recesses is pursued, a relatively expensive manufacturing method such as, for example, electric discharge machining is required, resulting in an expensive die assembly.

SUMMARY OF THE INVENTION

The present invention has been developed to overcome the above-described disadvantages.

It is accordingly an objective of the present invention to provide a highly reliable resin-sealed semiconductor device capable of enhancing the stability in thickness of a soldering material immediately below a semiconductor element that is secured to a metallic plate and ensuring the degree of adhesion between the metallic plate and a molding resin by executing a predetermined processing with respect to the metallic plate using a relatively inexpensive die assembly.

In accomplishing the above and other objectives, the resin-sealed semiconductor device according to the present invention includes a metallic plate and a semiconductor element soldered thereto, wherein the metallic plate has a semiconductor element mounting region (die pad region) formed on one surface thereof and a plurality of squared recesses defined in the one surface at approximately regular intervals at locations other than the semiconductor element mounting region.

This construction can enhance the stability in thickness of the soldering material and ensure the degree of adhesion between the metallic plate and the molding resin, making it possible to provide a highly reliable resin-sealed semiconductor device.

Because the plurality of squared recesses can be formed in the surface of the metallic plate by press working or coining, a relatively inexpensive die assembly can be used, thus enabling the manufacture of the resin-sealed semiconductor device at a low cost.

It is preferred that each of the plurality of recesses is made up of two squared recesses offset in a diagonal direction thereof. The two squared recesses may have a stepped bottom wall.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

This application is based on an application No. 2002-354812 filed Dec. 6, 2002 in Japan, the content of which is herein expressly incorporated by reference in its entirety.

Figure 1:
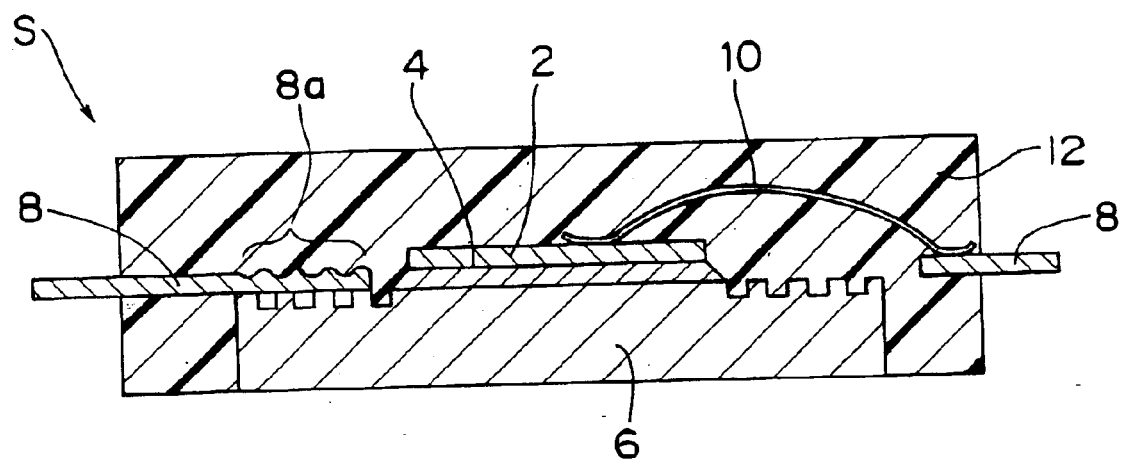
FIG. 1 is a vertical sectional view of a resin-sealed semiconductor device according to a first embodiment of the present invention.

Referring now to the drawings, there is shown in FIG. 1 a resin-sealed semiconductor device S according to a first embodiment of the present invention wherein a semiconductor element 2 is firmly fixed to a metallic plate 6 by a soldering material 4. In this resin-sealed semiconductor device S, surface electrodes formed on the semiconductor element 2 are electrically connected to associated electrodes of a frame 8 via respective aluminum wires 10, and the frame 8 is secured to a portion of the metallic plate 6 by ultrasonic bonding (explained later). The semiconductor element 2 together with the aluminum wires 10 and the like is entirely sealed with a molding resin 12.

The semiconductor element 2 is formed into, for example, a size of 15 by 15 millimeters square, while a Cu plate having, for example, a thickness of about 3 millimeters is used for the metallic plate 6. A material mainly composed of, for example, Sn is used for the soldering material 4.

Figure 2:
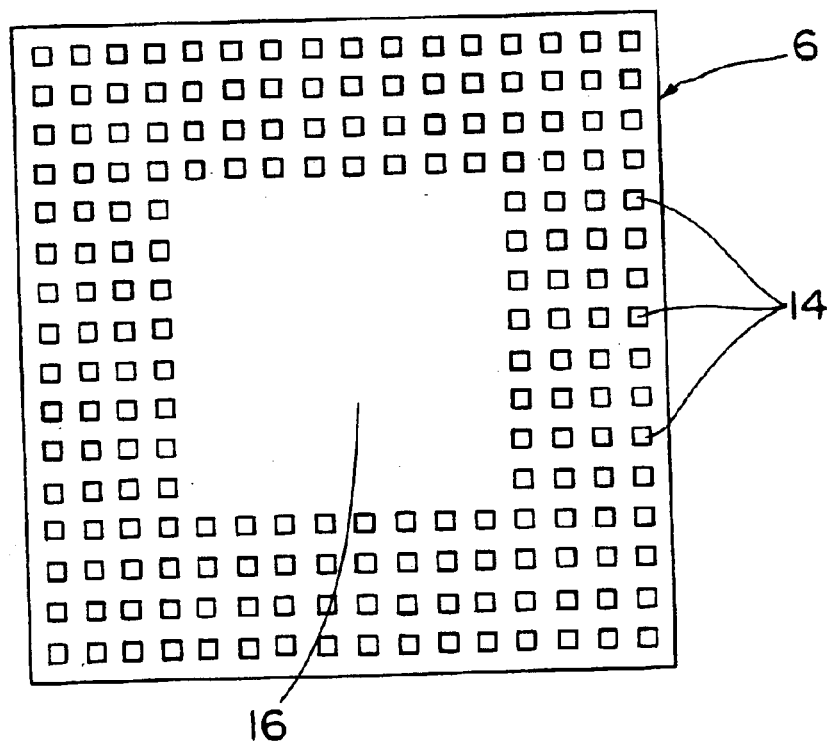
FIG. 2 is a top plan view of a metallic plate mounted in the resin-sealed semiconductor device of FIG. 1.

FIG. 2 depicts the metallic plate 6 as viewed from above prior to execution of the soldering process. As shown therein, the metallic plate 6 has a large number of squared recesses (dimples) 14 arrayed lengthwise and crosswise at approximately regular intervals (for example, about 400 $\mu$m) in one surface thereof at locations other than the spot on which the semiconductor element 2 is to be placed. The recesses 14 have substantially the same depth and each of them has four sides having, for example, a length of 200 $\mu$m. The die pad region 16, i.e., the spot on which the semiconductor element 2 is to be placed is substantially flat and has no recesses.

The portion of the metallic plate 6 referred to above to which the frame 8 is secured by ultrasonic bonding is a predetermined region on the surface of the metallic plate 6 in which the recesses 14 are formed. The reason for the use of ultrasonic bonding in bonding the frame 8 to the metallic plate 6 is as follows.

The use of a soldering material not containing Pb is preferred in order to restrain the load applied to the environment. In this case, the melting point of soldering materials to be selected is limited to within about 10° C. or below. Because of this, where the bonding of the semiconductor element to the metallic plate and the bonding of the frame to the metallic plate are both carried out by soldering, they must be done at the same time. This work is very complicated and requires a long heating period. Accordingly, an alloying reaction progresses at an interface on which soldering is carried out, thus shortening the life during which reliability can be guaranteed.

On the other hand, ultrasonic bonding is a kind of solid-phase welding in which any bonding material such as a solder or the like is not used. If such solid-phase welding is employed to the bonding of the frame to the metallic plate, it is sufficient to carry out soldering only once for the bonding of the semiconductor element to the metallic plate.

The solid-phase welding such as ultrasonic bonding needs deformation of a base material for strong or rigid bonding. In the case of ultrasonic bonding, a tool is used to press the frame against the metallic plate so that ultrasonic vibration is applied to the frame for plastic deformation while applying a load thereon, resulting in bonding of the frame to the metallic plate. If the metal surface is flat, however, much energy is required to deform the frame until it comes to have a sufficient bonding strength. In some cases, excessive deformation of the frame is required for firm bonding, but results in a reduction in the frame strength. In the case where a portion of the frame narrowed by such excessive deformation has only a strength half of the strength of the base material, there is a good chance of breakage.

In view of the above, according to the present invention, selective dimpling is carried out with respect to the surface of the metallic plate 6 to reduce the area of the bonding surface between the frame 8 and the metallic plate 6 by the space occupied by the recesses 14. In addition to this, the surface around each recess 14 is raised by press working or coining during formation thereof. For this reason, a plurality of protrusions are arrayed on the bonding surface of the metallic plate 6 with the frame 8 and, hence, the contact area between the metallic plate 6 and the frame 8 is small at the beginning of the bonding, making it possible to enhance the energy density and improve the bonding properties. In other words, even if the amount of energy given to the frame 8 is small, a sufficient deformation occurs at the bonded region to provide a predetermined bonding strength. A reduction in the frame thickness can be minimized by reducing the amount of energy given to the frame 8, making it possible to enhance the bonding stability.

It is to be noted here that a rugged portion 8a on the frame 8 as shown in FIG. 1 is formed when the frame 8 is secured to the metallic plate 6 by ultrasonic bonding.

Figure 3:
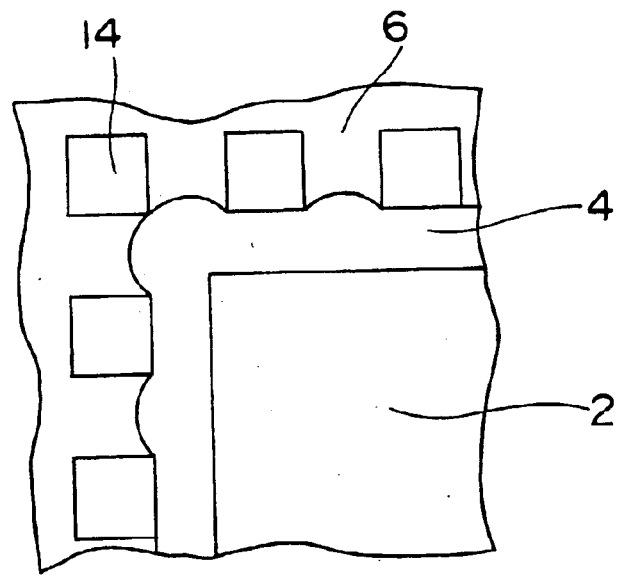
FIG. 3 is a partial top plan view of the resin-sealed semiconductor device of FIG. 1 when a semiconductor element is soldered to the metallic plate.

FIG. 3 depicts the state when the semiconductor element 2 is soldered to the metallic plate 6. As shown in FIG. 3, the soldering material 4 positioned immediately below the semiconductor element 2 spreads outwardly from the semiconductor element 2 during the mounting of the semiconductor element 2, but the spread of the soldering material 4 is blocked by edges of those of the recesses 14 that are positioned adjacent to and arrayed along edges of the semiconductor element 2. Also, at locations between the neighboring recesses 14, the spread of the soldering material 4 is restrained so as to form a gentle arc or curvature. Even if the soldering material 4 enters some of the recesses 14 due to vibration or the like, a substantial variation in the thickness of the soldering material 4 positioned immediately below the semiconductor element 2 is avoided because the volume of each recess 14 is sufficiently small relative to that of the soldering material 4.

The reason for pursuing the stability in the thickness of the soldering material is as follows.

The component of the metallic plate such as, for example, Cu or Al differs greatly in the coefficient of linear expansion from Si that is a component of the semiconductor element. Accordingly, thermal stresses are often generated to the extent that the soldering material is plastic-deformed with a temperature change during the use of the semiconductor element. In some cases, cracks occur and develop within the soldering material. Particularly in the case of power semiconductor devices, it is important to ensure the property of radiating heat from the semiconductor element, and the development of such cracks within the soldering material increases the thermal resistance of heat-radiating paths from the semiconductor element.

Further, where the soldering material is thin (for example, less than 50$\mu$m), the amount of strain that may be generated within the soldering material is relatively large and the speed of development of the cracks becomes high. As the thickness of the soldering material increases, both the strain within the soldering material and the speed of development of the cracks decrease. In the heat-radiating paths from the semiconductor element, however, the thermal resistance when heat passes through the layer of the soldering material is proportional to the thickness of the soldering material, and the smaller is the thickness of the soldering material, the smaller the thermal resistance is. By way of example, in the case of semiconductor elements having a size of 15 by 15 millimeters square, the thermal resistance increases by about 0.01° C./W for each increase of 100 $\mu$m in the thickness of the soldering material. Accordingly, if a semiconductor element having a thermal resistance of about 0.15° C./W is formed into a good 300 $\mu$m thickness, the thermal resistance thereof is not negligible.

Because of this, stably maintaining the thickness of the soldering material within a predetermined range of, for example, 50–300 $\mu$m is important to ensure the life of the semiconductor elements and the stability in the thermal resistance. It is preferred that variations in the thickness of the soldering material be controlled within several tens of microns.

Where the metallic plate and the semiconductor element are sealed with a molding resin, deformation of the soldering material with a temperature change of the semiconductor element can be restrained by the use of a molding resin having a coefficient of linear expansion close to that of the metallic plate. More specifically, because the molding resin having a coefficient of linear expansion greater than that of the semiconductor element but extremely close to that of the metallic plate is bonded to the surface of the semiconductor element, expansion and contraction of the semiconductor element with a temperature change becomes close to that of the metallic plate. As a result, the amount of strain in the soldering material between the semiconductor element and the metallic plate can be reduced, making it possible to considerably restrain generation and development of cracks within the soldering material.

It is important for this effect to firmly bond the molding resin to the surface of the metallic plate, and a sufficient effect cannot be achieved under the conditions in which the surface of the metallic plate and that of the molding resin are separated from each other. Accordingly, firm bonding of the molding resin and the metallic plate is particularly important to avoid production of defective articles that has been hitherto caused by the development of cracks in the soldering material.

Conversely, at an interface between the molding resin and the metallic plate, a problem of separation sometimes arises that may be caused by generation of a shearing stress with a temperature change due to a difference in the coefficient of linear expansion of the molding resin and the metallic plate. To avoid this, formation of recesses in the surface of the metallic plate is effective, and it is possible to suppress generation of slippage parallel to the interface, which may be caused by the difference in the coefficient of linear expansion, by forming wall surfaces perpendicular to the interface. Because the shearing stress is proportional to the distance, the presence of the wall surfaces at relatively small intervals is effective to reduce the shearing stress.

For the above-described reasons, a large number of squared recesses 14 having such vertical walls are arrayed lengthwise and crosswise at approximately regular intervals in the semiconductor device according to the present invention. A method of forming such recesses is explained hereinafter.

The recesses 14 can be formed in the substantially flat surface of the metallic plate at a low cost by the use of press working. Electric discharge machining or cutting work is generally used to make a die assembly for use in such press working. Although electric discharge machining is relatively costly, it has the advantage of being capable of freely obtaining any desired shape.

However, cutting work can be employed to make a die assembly for use in forming the squared recesses as employed in the present invention. That is, the die assembly can be made by causing a rotating toothed member to run over a base material of the die assembly lengthwise and crosswise at approximately regular intervals. The rotating toothed member is restricted in the width thereof, and a width of about 180~200 $\mu$m is a limit for sufficient workability. When the die assembly is made so as to have a plurality of squared projections by causing the rotating toothed member to run over the base material of the die assembly, if the size of the projections is small, there is a good chance that the projections may be broken during formation of the recesses. To avoid such breakage, it is necessary to enlarge the size of the squared projections, and setting the size to more than 200 $\mu$m offers sufficient durability.

As described hereinabove, according to the present invention, separation at the interface between the molding resin and the metallic plate is avoided by forming a large number of recesses 14 in the surface of the metallic plate 6, and a relatively inexpensive die assembly made by cutting work is used to form the recesses 14. Further, in consideration of durability in making the die assembly, a plurality of projections having a size of 200 $\mu$m by 200 $\mu$m square are arrayed lengthwise and crosswise at approximately regular intervals of about 400 $\mu$m.

It is to be noted here that a region of the metallic plate on which the semiconductor element is to be placed (die pad region) is made flat so that the thickness of the soldering material positioned immediately below the semiconductor element may be substantially constant. However, if projections lower than the desired thickness of the soldering material are arrayed at corners immediately below the semiconductor element, the minimum thickness of the soldering material can be guaranteed, making it possible to enhance the stability in the thickness of the soldering material.

Figure 4:
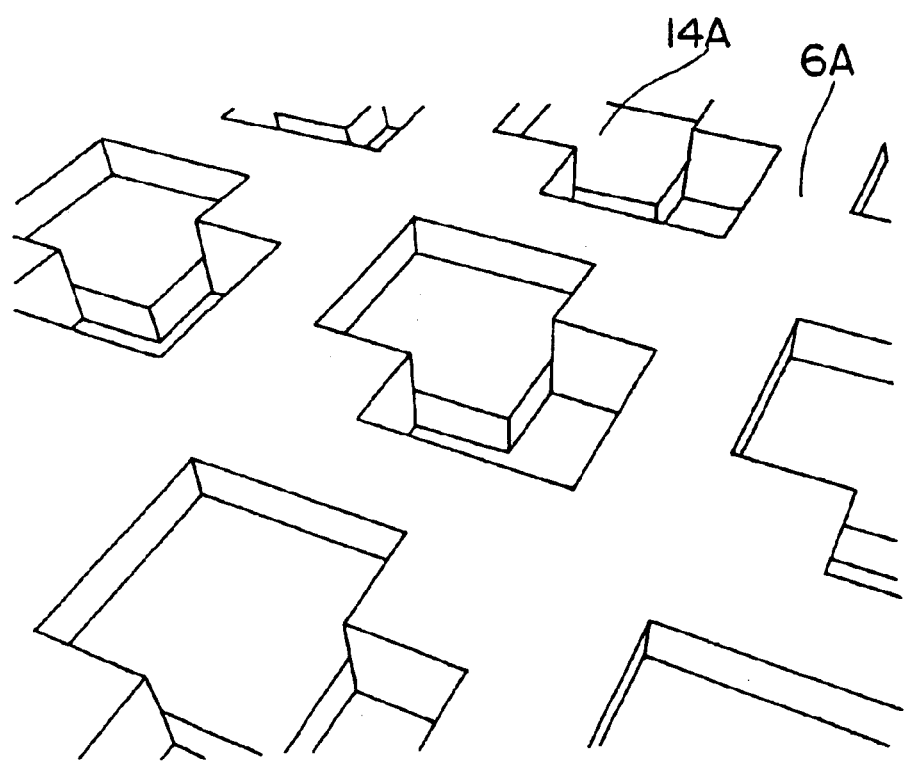
FIG. 4 is a partial perspective view of a metallic plate mounted in a resin-sealed semiconductor device according to a second embodiment of the present invention.

FIG. 4 depicts a portion of a metallic plate 6A mounted in a resin-sealed semiconductor device according to a second embodiment of the present invention. As shown therein, a large number of octagonal recesses 14A are formed lengthwise and crosswise at approximately regular intervals in the surface of the metallic plate 6A other than the die pad region. Each recess 14A has a stepped bottom wall and can be formed by overlapping two recesses different in depth but identical in top plan view to the recesses 14 as employed in the semiconductor device S according to the first embodiment referred to above in the manner in which the two recesses are offset a predetermined length in the diagonal direction thereof.

Dimpling of the metallic plate 6A is carried out using a first die assembly for use in dimpling the metallic plate 6 as employed in the first embodiment of the present invention and a second die assembly substantially identical in shape to the first die assembly but different therefrom in height of the squared projections formed on the surface thereof. In this case, dual dimpling is employed wherein the first and second die assemblies are shifted one from the other by a predetermined length and subsequently used in turn.

Such dual dimpling applied to the surface of the metallic plate 6A increases the total area of the side or vertical walls of the recesses 14A, reduces the space between the neighboring recesses 14A, and renders a portion of a bottom wall formed by the second die assembly to overhang a bottom wall formed by the first die assembly, making it possible to reduce the shearing stress acting between the molding resin and the metallic plate and enhance the degree of adhesion.

Figure 5:
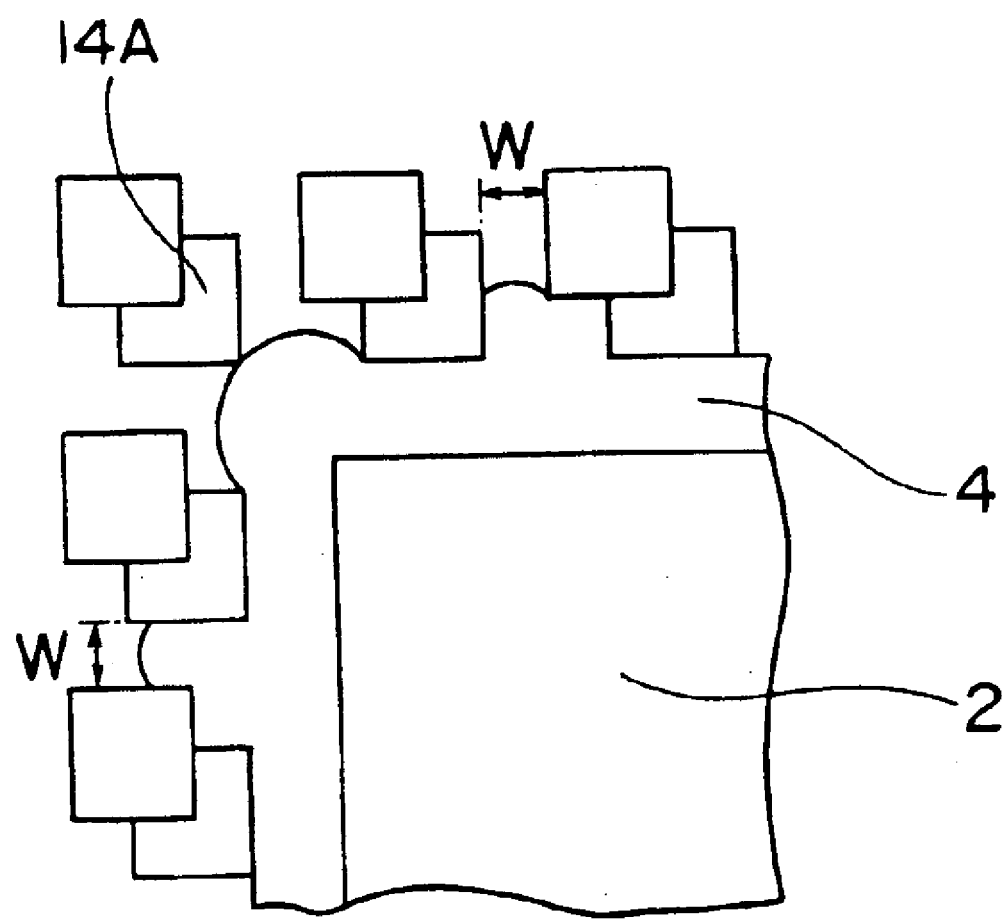
FIG. 5 is a partial top plan view of the resin-sealed semiconductor device of FIG. 4 when a semiconductor element is soldered to the metallic plate.

FIG. 5 depicts the state when the semiconductor element 2 is soldered to the metallic plate 6A. As shown in FIG. 5, the space W between the recesses 14A existing in the same plane as the semiconductor element mounting plane is reduced equally in both the longitudinal and crosswise directions. Addition of the press working only once increases the solder blocking effect and further enhances the stability in the thickness of the soldering material.

It is preferred that the length of offset of the second die assembly relative to the first die assembly be set to about half of the pitch of the recesses. If a checkered pattern is employed wherein the first and second die assemblies do not overlap each other, the work depth by the second die assembly cannot be made large due to work-hardening during press working by the first die assembly. Accordingly, the height of the side or vertical walls perpendicular to the bonding surface that acts to reduce the shearing stress is undesirably reduced. In addition, if the length of offset is small, the solder blocking effect reduces and the pitch of the recesses must be reduced to some extent.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A resin-sealed semiconductor device comprising:
   a metallic plate; and
   a semiconductor element soldered to said metallic plate,
   wherein said metallic plate has a semiconductor element mounting region formed on one surface thereof and a plurality of squared recesses defined in said one surface at approximately regular intervals along a perimeter of the semiconductor element mounting region at locations other than the semiconductor element mounting region.

2. The resin-sealed semiconductor device according to claim 1, further comprising a frame secured to said metallic plate at a location where said plurality of recesses are formed.

3. A resin-sealed semiconductor device comprising:
   a metallic plate; and
   a semiconductor element soldered to said metallic plate;
   wherein said metallic plate has a semiconductor element mounting region formed on one surface thereof and a plurality of recesses defined in said one surface at approximately regular intervals at locations other than the semiconductor element mounting region, and wherein each of said plurality of recesses comprises two squared recesses offset in a diagonal direction thereof.

4. The resin-sealed semiconductor device according to claim 3, wherein said two squared recesses have different depths.

5. The resin-sealed semiconductor device according to claim 4, further comprising a frame secured to said metallic plate at a location where said plurality of recesses are formed.

6. A resin-sealed semiconductor device comprising:
   a metallic plate; and
   a semiconductor element soldered to said metallic plate,
   wherein said metallic plate has a semiconductor element mounting region formed on one surface thereof and a plurality of squared recesses defined in said one surface and arrayed at approximately regular intervals at locations other than the semiconductor element mounting region.

7. The resin-sealed semiconductor device according to claim 6, wherein said plurality of squared recesses are arrayed lengthwise and crosswise at approximately regular intervals at locations other than the semiconductor element mounting region.

* * * * *